United States Patent
Tsorng et al.

(10) Patent No.: US 12,507,359 B2
(45) Date of Patent: Dec. 23, 2025

(54) LOCKING HANDLE FOR SERVER RACK TRAY

(71) Applicant: Quanta Computer Inc., Taoyuan (TW)

(72) Inventors: Yaw-Tzorng Tsorng, Taoyuan (TW);
Ming-Lung Wang, Taoyuan (TW);
Nan-Chun Wu, Taoyuan (TW);
Tung-Shiun Yang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 127 days.

(21) Appl. No.: 18/471,105

(22) Filed: Sep. 20, 2023

(65) Prior Publication Data

US 2025/0040074 A1  Jan. 30, 2025

Related U.S. Application Data

(60) Provisional application No. 63/515,534, filed on Jul. 25, 2023.

(51) Int. Cl.
*H05K 5/02* (2006.01)
*H05K 7/14* (2006.01)

(52) U.S. Cl.
CPC ........... *H05K 5/0221* (2013.01); *H05K 5/023* (2013.01); *H05K 7/1489* (2013.01)

(58) Field of Classification Search
CPC ... E05B 1/00; E05B 1/03; E05B 13/04; E05B 13/106; H05K 7/12; H05K 5/0221
USPC .................................. 292/336.3, 169.1, 176
See application file for complete search history.

(56) References Cited

U.S. PATENT DOCUMENTS

| | | | |
|---|---|---|---|
| 6,000,768 A * | 12/1999 | Dials | H05K 5/0221 312/319.2 |
| 6,339,864 B1 * | 1/2002 | Albrecht | E05D 7/125 16/382 |
| 8,570,730 B2 * | 10/2013 | Li | G06F 1/185 361/801 |
| 9,609,778 B1 * | 3/2017 | Spencer | G06F 1/183 |
| 9,699,942 B1 * | 7/2017 | Fu | G11B 33/142 |
| 9,801,299 B1 * | 10/2017 | Chen | G06F 1/187 |
| 9,918,403 B2 * | 3/2018 | Bailey | G11B 33/128 |
| 11,350,546 B2 * | 5/2022 | Chang | H05K 7/20727 |
| 2005/0152106 A1 * | 7/2005 | Coster | H05K 5/0221 361/679.58 |
| 2013/0176676 A1 * | 7/2013 | Keffeler | H05K 7/1487 361/679.37 |
| 2013/0335913 A1 * | 12/2013 | Brashers | H05K 7/1489 312/223.2 |

(Continued)

*Primary Examiner* — Nathan Cumar
(74) *Attorney, Agent, or Firm* — NIXON PEABODY LLP

(57) ABSTRACT

A handle for securing a tray of a computing system comprises a baseplate and a locking pin. The baseplate can be movably coupled to the tray and be movable between a first position and a second position. The first position prevents removal of the tray and the second position allows removal of the tray. The locking pin extends from the baseplate and can be coupled to a first portion of the tray when the baseplate is in the first position, and a second portion of the tray when the baseplate is in the second position. The locking pin is movable in a first direction relative to the baseplate to be coupled to the first portion of the tray and the second portion of the tray, and a second direction relative to the baseplate to be uncoupled from the first portion of the tray and the second portion of the tray.

12 Claims, 7 Drawing Sheets

(56) References Cited

U.S. PATENT DOCUMENTS

| | | | |
|---|---|---|---|
| 2015/0185790 A1* | 7/2015 | Fan | G06F 1/186 |
| | | | 361/679.02 |
| 2020/0068740 A1* | 2/2020 | Tsorng | H05K 7/1487 |
| 2020/0100392 A1* | 3/2020 | Iyengar | H05K 7/1487 |
| 2021/0127515 A1* | 4/2021 | Wang | H05K 5/0221 |
| 2021/0251098 A1* | 8/2021 | Gao | H05K 7/1417 |
| 2021/0259417 A1* | 8/2021 | Cooper | E05B 47/023 |
| 2022/0225526 A1* | 7/2022 | Tsorng | H05K 7/1489 |

* cited by examiner

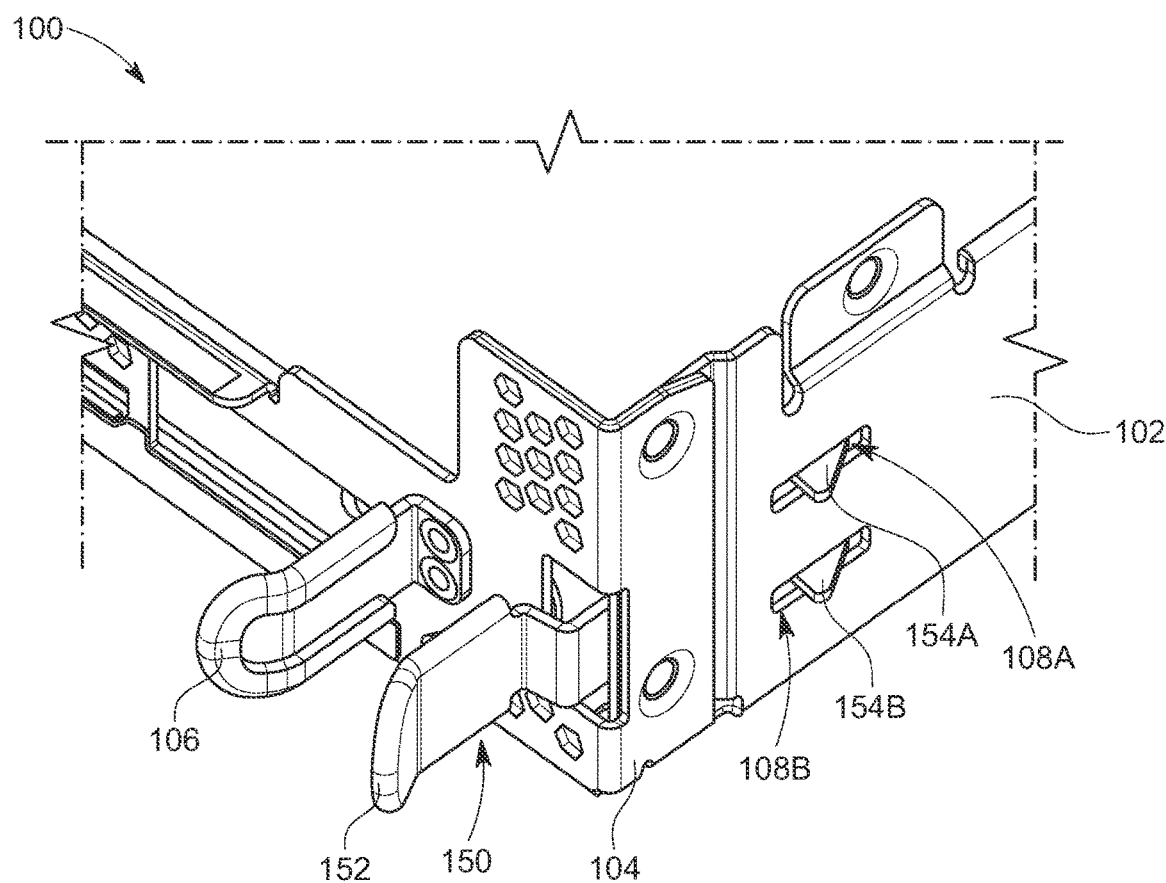
FIG. 1
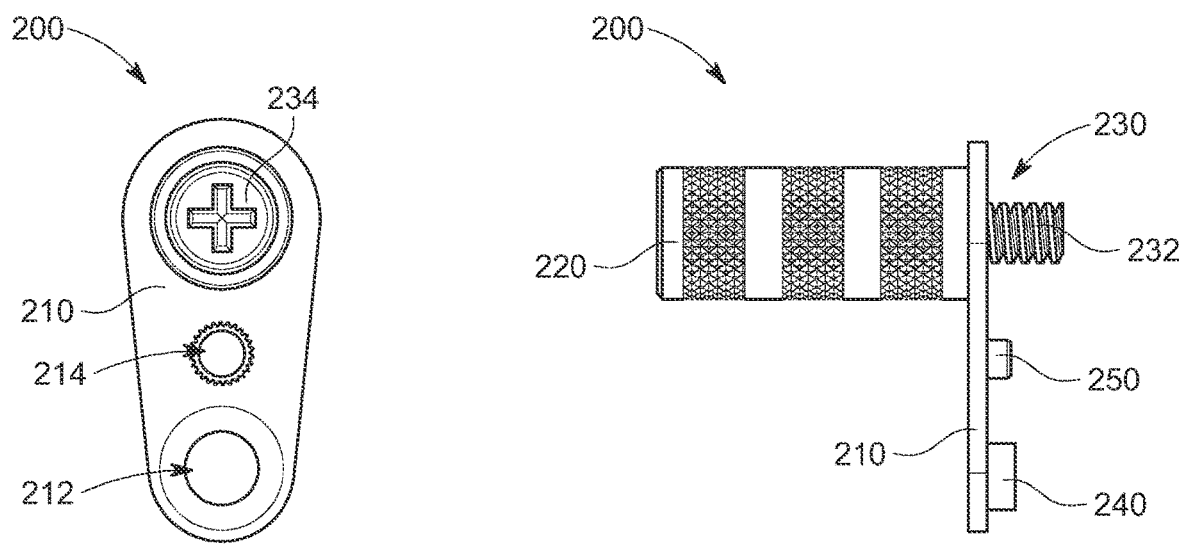
FIG. 2A
FIG. 2B

LOCKING HANDLE FOR SERVER RACK TRAY

CROSS-REFERENCE TO RELATED APPLICATIONS

This application claims priority from and the benefit of U.S. Provisional Patent Application Ser. No. 63/515,534, filed on Jul. 25, 2023, titled "Rotatable Bracket for System Tray in Electronic Equipment," which is hereby incorporated by reference herein in its entirety.

FIELD OF THE INVENTION

The present disclosure relates generally to a movable handle for securing a movable tray of a computing system, and more specifically, to a movable handle with a locking pin that mates with different portions of the tray in order to prevent a latch of the tray from being disengaged.

BACKGROUND OF THE INVENTION

Rack-mount server systems often include movable trays on which system components can be mounted. These trays are configured to slide into and out of the rack, and can be secured by a latch mounted on the tray that engages the rack to prevent the tray from being removed. The tray may also include a handle that a user or technician can grasp to aid in removing the tray from the rack. However, the latch is often left unshielded and can inadvertently be disengaged from the rack due to accidental contact. Thus, new systems and devices are needed for securing these trays within the rack and for preventing inadvertent disengagement of the latch.

SUMMARY OF THE INVENTION

The term embodiment and like terms, e.g., implementation, configuration, aspect, example, and option, are intended to refer broadly to all the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In a first implementation, the present disclosure is directed to a handle for securing a tray of a computing system. The handle includes a baseplate and a locking pin. The baseplate is configured to be movably coupled to the tray, and is movable between at least a first position and a second position relative to the tray when coupled to the tray. The first position prevents removal of the tray from the computing system and the second position allows removal of the tray from the computing system. The locking pin extends from the baseplate and is configured to be coupled to (a) a first portion of the tray when the baseplate is in the first position, and (b) a second portion of the tray when the baseplate is in the second position. The locking pin is movable in (i) a first direction relative to the baseplate to be coupled to the first portion of the tray and the second portion of the tray, and (ii) a second opposing direction relative to the baseplate to be uncoupled from the first portion of the tray and the second portion of the tray.

In some aspects of the first implementation, the handle further includes a fastening pin extending from the baseplate. The fastening pin is configured to be inserted into an aperture defined in the tray to movably couple the baseplate to the tray.

In some aspects of the first implementation, the fastening pin is configured to rotatably mate with the aperture defined in the tray such that the baseplate is rotatable between the first position and the second position.

In some aspects of the first implementation, the handle further includes a guide rod extending from the baseplate. The guide rod is configured to extend into a slot defined in the tray and move within the slot as the baseplate moves between the first position and the second position.

In some aspects of the first implementation, the movement of the guide rod within the slot limits movement of the baseplate relative to the tray.

In some aspects of the first implementation, when guide rod is positioned at a first end of the slot, the locking pin is aligned with the first portion of the tray, and when the guide rod is positioned at a second end of the slot, the locking pin is aligned with the second portion of the tray.

In some aspects of the first implementation, the locking pin is configured to extend into a first locking aperture defined in the tray to secure the baseplate in the first position, to extend into a second locking aperture defined in the tray to secure the baseplate in the second position; and to retract from the first locking aperture or the second locking aperture to allow the baseplate to move between the first position and the second position.

In some aspects of the first implementation, the locking pin includes external threads that are configured to mate with internal threads of the first locking aperture to secure the baseplate in the first position, and to mate with internal threads of the second locking aperture to secure the baseplate in the second position.

In some aspects of the first implementation, the handle further includes a grip portion extending from the baseplate. The locking pin is disposed partially within the grip portion and is axially movable within the grip portion (i) in the first direction relative to the baseplate to be inserted into the first aperture and the second aperture, and (ii) in the second direction relative to the baseplate to be removed from the first aperture and the second aperture.

In some aspects of the first implementation, the locking pin is formed by a captive screw, a thumbscrew, or a spring-loaded rod.

In a second implementation, the present disclosure is directed to a tray module for use with a rack of a computing system. The tray module includes a tray, a latch, and a handle. The tray is configured to hold one or more electronic components thereon and is insertable into the rack. The latch is coupled to the tray and is configured to releasably engage the rack to prevent the tray from being removed from the rack. The handle is movably coupled to the tray and includes a locking pin configured to be coupled to a first portion of the tray when the handle is in a first position relative to the tray, and to be coupled to a second portion of the tray when the handle is in a second position relative to the tray. When the handle is in the first position, the handle locks the latch and does not allow the latch to be disengaged from the server rack. When the handle is in the second position, the handle does not lock the latch and allows the latch to be disengaged from the server rack.

In some aspects of the second implementation, the latch includes (i) one or more locking projections configured to extend through one or more corresponding slots of the server rack and (ii) a resilient tab extending away from the tray that is movable to a deflected position to remove the one or more locking projections from the one or more corresponding slots of the server rack. The handle includes a grip portion that extends away from the tray and is generally parallel to the resilient tab.

In some aspects of the second implementation, when the handle is in the first position, the grip portion of the handle is positioned adjacent to the resilient tab such that the resilient tab is not allowed to move to the deflected position to remove the one or more locking projections from the one or more corresponding slots of the server rack, and when the handle is in the second position, the grip portion of the handle is spaced apart from the resilient tab to allow the resilient tab to move to the deflected position to remove the one or more locking projections from the one or more corresponding slots of the server rack.

In some aspects of the second implementation, the handle includes a fastening pin that rotatably mates with an aperture defined in the tray such that the handle is rotatable between the first position and the second position.

In some aspects of the second implementation, the handle further includes a guide rod that extends from the baseplate into a slot defined in the tray. The guide rod moves within the slot as the handle moves between the first portion and the second portion to limit movement of the handle relative to the tray.

In some aspects of the second implementation, when guide rod is positioned at a first end of the slot, the locking pin is aligned with the first portion of the tray, and when the guide rod is positioned at a second end of the slot, the locking pin is aligned with the second portion of the tray.

In some aspects of the second implementation, when the handle is in the first position, the locking pin is aligned with and extendible into a first locking aperture defined in the tray to secure the handle in the first position, when the handle is in the second position, the locking pin is aligned with and extendible into a second locking aperture defined in the tray to secure the handle in the second position, and when the locking pin is not inserted into the first locking aperture or the second locking aperture, the handle is movable between the first position and the second position.

In some aspects of the second implementation, the locking pin includes external threads that mate with internal threads of the first locking aperture to secure the baseplate in the first position, and that mate with internal threads of the second locking aperture to secure the baseplate in the second position.

In some aspects of the second implementation, the locking pin is disposed partially within the grip portion and is axially movable relative to the grip portion. The locking pin moves in a first direction out of the grip portion and into the first aperture or the second aperture to secure the handle in the first position or the second position, and moves in a second opposing direction into the grip portion and out of the first aperture or the second aperture to allow the handle to move between the first position and the second position.

In some aspects of the second implementation, the locking pin is formed by a captive screw, a thumbscrew, or a spring-loaded rod.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

FIG. 1 is a perspective view of a prior art handle and movable tray, according to aspects of the present disclosure.

FIG. 2A is a front view of a handle for securing a movable tray of a computing system, according to aspects of the present disclosure.

FIG. 2B is a side view of the handle of FIG. 2A, according to aspects of the present disclosure.

DETAILED DESCRIPTION

Figure 3:
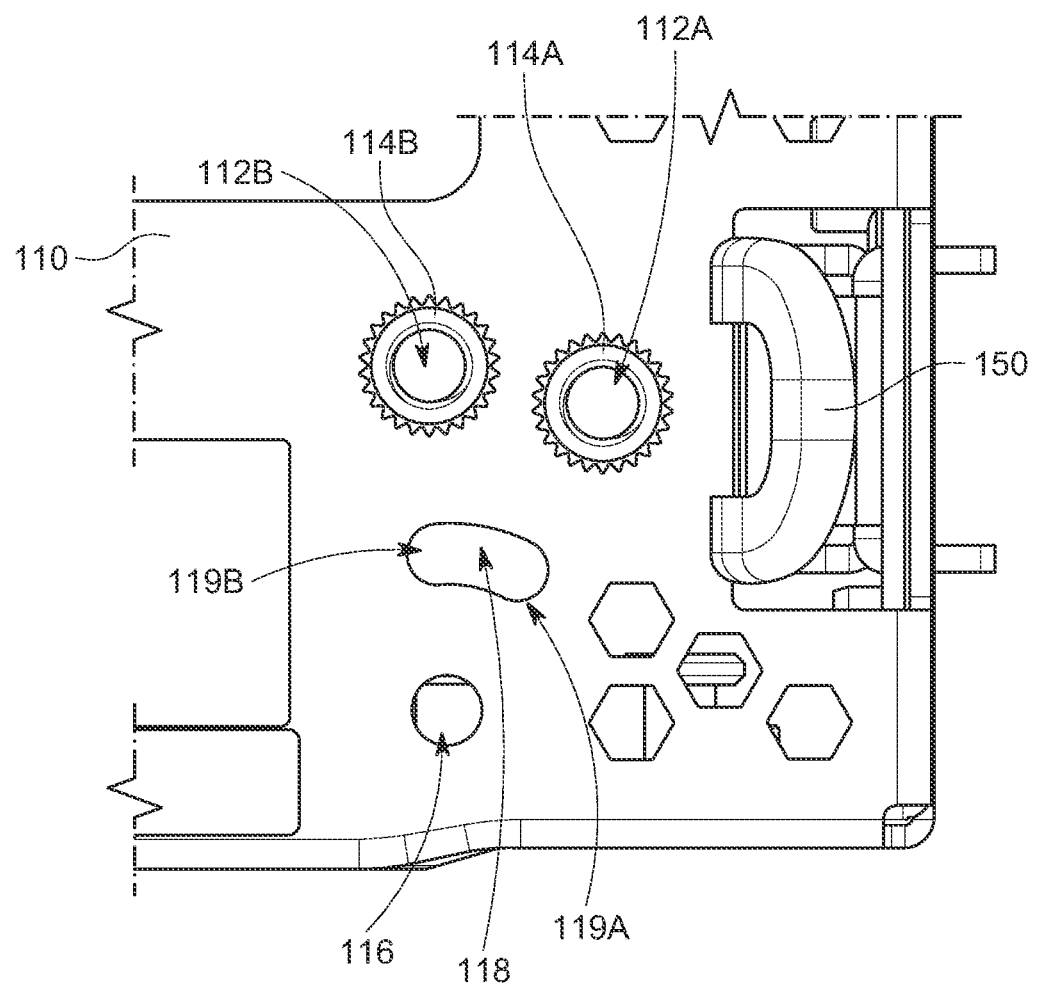
FIG. 3 is a front view of a tray for use with the handle of FIGS. 2A and 2B, according to aspects of the present disclosure.

Disclosed herein is a locking handle for securing a movable tray of a computing system. The tray is insertable into a rack (e.g., a server rack) of the computing system, and carries one or more electronic components or devices therein. A latch is coupled to the tray, and can engage with the rack to prevent the tray from being pulled out of the rack.

The handle is coupled to the tray and is movable between at least a first position and a second position. In the first position, a locking pin of the handle can be coupled to a first portion of the tray, and in the second position, the locking pin can be coupled to a second portion of the tray. When the handle is in the first position, the handle is disposed in close proximity to the latch and prevents the latch from being moved to a deflected position to disengage the rack. When the handle is in the second position, the handle is spaced apart from the latch and allows the latch to move to the deflected position and disengages the rack. The tray can then be removed from the rack. In some of the implementations disclosed herein, the tray includes separate apertures that the locking pin extends into to couple the handle to the tray in the first position and the second position. In some of the implementations disclosed herein, the separate apertures each include a threaded portion, and the locking pin is screwed into these threaded portions to couple the handle to the tray in the first position and the second position.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1 shows a prior art computing system 100 that includes a rack 102, a tray 104 that can be inserted into and removed from the rack 102, a stationary handle 106 coupled to the tray 104, and a latch 150 that is coupled to the tray 104. In some implementations, the computing system 100 is a server system and the rack 102 is a server rack. The server rack can hold multiple trays that may each include a server device or component (and/or other electronic devices or components thereon).

The tray 104 will generally include one or more electronic components thereon, such as one or more computing devices. The latch 150 is configured to secure the tray 104 to the rack 102, and includes a resilient tab 152 and locking projections 154A and 154B. When the resilient tab 152 is in the relaxed position shown in FIG. 1, the locking projections 154A and 154B extend through corresponding slots 108A and 108B defined in the rack 102, such that the latch 150 engages the rack 102. The positioning of the locking projections 154A and 154B within the corresponding slots 108A and 108B prevents the tray 104 from being removed from the rack 102. Thus, even if a user or technician attempts to remove the tray 104 from the rack 102 by pulling on the stationary handle 106, the latch 150 prevents the tray 104 from moving.

The resilient tab 152 of the latch 150 can be deflected toward the stationary handle 106 to disengage the latch 150 from the rack 102. This movement of the resilient tab 152 causes the locking projections 154A and 154B to move in the same direction and no longer be positioned within the corresponding slots 108A and 108B. The user or technician is then free to remove the tray 104 from the rack 102 by pulling on the stationary handle 106. Thus, the latch 150 acts to secure the tray 104 within the rack 102. However, because the resilient tab 152 extends away from the tray 104, there is a risk that accidental force applied to the resilient tab 152 (for example if the user brushes against the resilient tab 152 when walking near the computing system 100) will disengage the latch 150 from the rack 102 and allow the tray 104 to be removed.

FIGS. 2A and 2B show a locking handle 200 (referred to herein as the handle 200) that can be used in place of the stationary handle 106. The handle 200 includes a baseplate 210, a grip portion 220, a locking pin 230, a fastening pin 240, and a guide rod 250. As shown, the locking pin 230, the fastening pin 240, and the guide rod 250 all extend from the baseplate 210 in the opposite direction as the grip portion 220. The fastening pin 240 can be used to movably couple the baseplate 210 to a tray (similar to the tray 104 of FIG. 1) so that the baseplate 210 is movable between different positions relative to the tray. The locking pin 230 is configured to be coupled to different portions of the tray to lock the baseplate 210 in the corresponding position. In general, the position of the baseplate 210 will be the same as the position of the handle 200 as a whole. Any references to the position of the handle 200 or the baseplate 210 herein are equally applicable to the position of the other, unless otherwise noted.

In some implementations, one or both of the fastening pin 240 and the guide rod 250 may be releasably coupled to the baseplate 210. For example, the fastening pin 240 can be mounted within and/or coupled to a fastening aperture 212 defined in the baseplate 210. Similarly, the guide rod 250 can be mounted within and/or coupled to a guide aperture 214 defined in the baseplate 210. In some implementations, the fastening pin 240, the guide rod 250, the fastening aperture 212, and the guide aperture 214 can all be threaded so that the fastening pin 240 and the guide rod 250 can be screwed into the fastening aperture 212 and the guide aperture 214, respectively. In other implementations, the fastening pin 240 and the guide rod 250 can be coupled via a snap-fit connection or an interference-fit connection to the fastening aperture 212 and the guide aperture 214, respectively.

The locking pin 230 is movable in directions that are normal to the baseplate 210 (e.g., perpendicular to the plane formed by the baseplate 210) in order to be coupled to and uncoupled from the different portions of the tray 110 (FIG. 1). In the illustrated implementation, the locking pin 230 is partially disposed within the grip portion 220 and is axially movable relative the grip portion 220. Thus, the locking pin 230 moves axially within the grip portion 220 as it moves normal to the baseplate 210.

The illustrated implementation also shows the locking pin 230 as a captive screw that includes a threaded end portion 232 with external threads, and screw head 234. A user or technician can turn the screw head 234 (for example with a screwdriver) in order to cause the threaded end portion 232 of the locking pin 230 to mate with different threaded portions of the tray 110 and move normal to the baseplate 210. The locking pin 230 can generally include a retaining flange or washer (not shown) that is disposed within the interior space of the grip portion 220 and is not removable therefrom. When the threaded end portion 232 is not mated to any other threaded component, the retaining flange or washer prevents that the locking pin 230 from being removed from and/or falling out of the grip portion 220.

While the locking pin 230 is shown as a captive screw in FIGS. 2A and 2B, the locking pin 230 could also be formed from other structures that are at least partially disposed within the grip portion 220, such as a thumbscrew or a spring-loaded rod. In these implementations, the locking pin 230 may still include the retaining flange or washer disposed within the interior space of the grip portion 220. Moreover, while the locking pin 230 is shown in FIGS. 2A and 2B as being partially disposed within the grip portion 220, other implementations of the handle 200 may not include the grip portion 220. In these implementations, the locking pin 230 may be coupled to the baseplate 210 in a manner that allows the locking pin 230 to move normal to the baseplate 210.

FIG. 3 shows the front panel of a tray 110 which the handle 200 can be coupled to. The tray 110 is generally similar to the tray 104 of FIG. 1, and includes the latch 150 coupled thereto to secure the tray 110 within the rack 102. The tray 110 includes a first locking aperture 112A and a second locking aperture 112B. The locking pin 230 of the handle 200 (FIGS. 2A and 2B) can be inserted into the first locking aperture 112A and the second locking aperture 112B, to thereby couple the locking pin 230 to the different portions of the tray 110 and to lock the handle 200 into different positions relative to the tray 110. The handle 200 can be moved between these positions to either prevent the latch 150 from being disengaged from the rack 102, or to allow the latch 150 to be disengaged from the rack 102. Together, the tray 110, the latch 150, and the handle 200 can be referred to as a tray module.

In the illustrated implementation, the first locking aperture 112A includes a threaded structure 114A mounted therein that forms internal threads of the first locking aperture 112A, and the second locking aperture 112B includes a threaded structure 114B mounted therein that forms internal threads of the second locking aperture 112B. In implementations where the locking pin 230 includes the threaded end portion 232 and the screw head 234 (FIGS. 2A and 2B), the screw head 234 can be rotated to cause the external threads of the threaded end portion 232 to mate with the internal threads of the first locking aperture 112A or the second locking aperture 112B, and to cause the locking pin 230 to move normal to the baseplate 210 into the first locking aperture 112A or the second locking aperture 112B. The mating between the threaded end portion 232 and either the first locking aperture 112A or the second locking aperture 112B couples the locking pin 230 to the different portions of the tray 110 and secures the handle 200 in place. The screw head 234 can also be rotated to cause the external threads of the threaded end portion 232 to disengage from the internal threads of the first locking aperture 112A or the second locking aperture 112B, and to cause the locking pin 230 to move normal to the baseplate 210 out of the first locking aperture 112A or the second locking aperture 112B The front panel of the tray 110 also includes a fastening aperture 116 and a guide slot 118 defined therein. The fastening aperture 116 is sized to receive the fastening pin 240 (FIG. 2B) of the handle 200 to thereby movably couple the baseplate 210 to the tray 110. In some implementations, the fastening pin 240 rotatably mates with the fastening aperture 116 so that the baseplate 210 can rotate relative to the tray 110. The guide slot 118 is sized to receive the guide rod 250 (FIG. 2B) of the handle 200. As the baseplate 210 moves relative to the tray 110, the guide rod 250 moves within the guide slot 118. Thus, the size of the guide slot 118 limits the movement of the baseplate 210 relative to the tray 110. When the guide rod 250 is positioned at a first end 119A of the guide slot 118, the locking pin 230 will be aligned with the first locking aperture 112A. When the guide rod 250 is positioned at a second end 119B of the guide slot 118, the locking pin 230 will be aligned with the second locking aperture 112B. In the illustrated implementation, the guide slot 118 is arc-shaped to correspond to the rotational movement of the baseplate 210, which is rotatably coupled to the tray 110.

Figure 4:
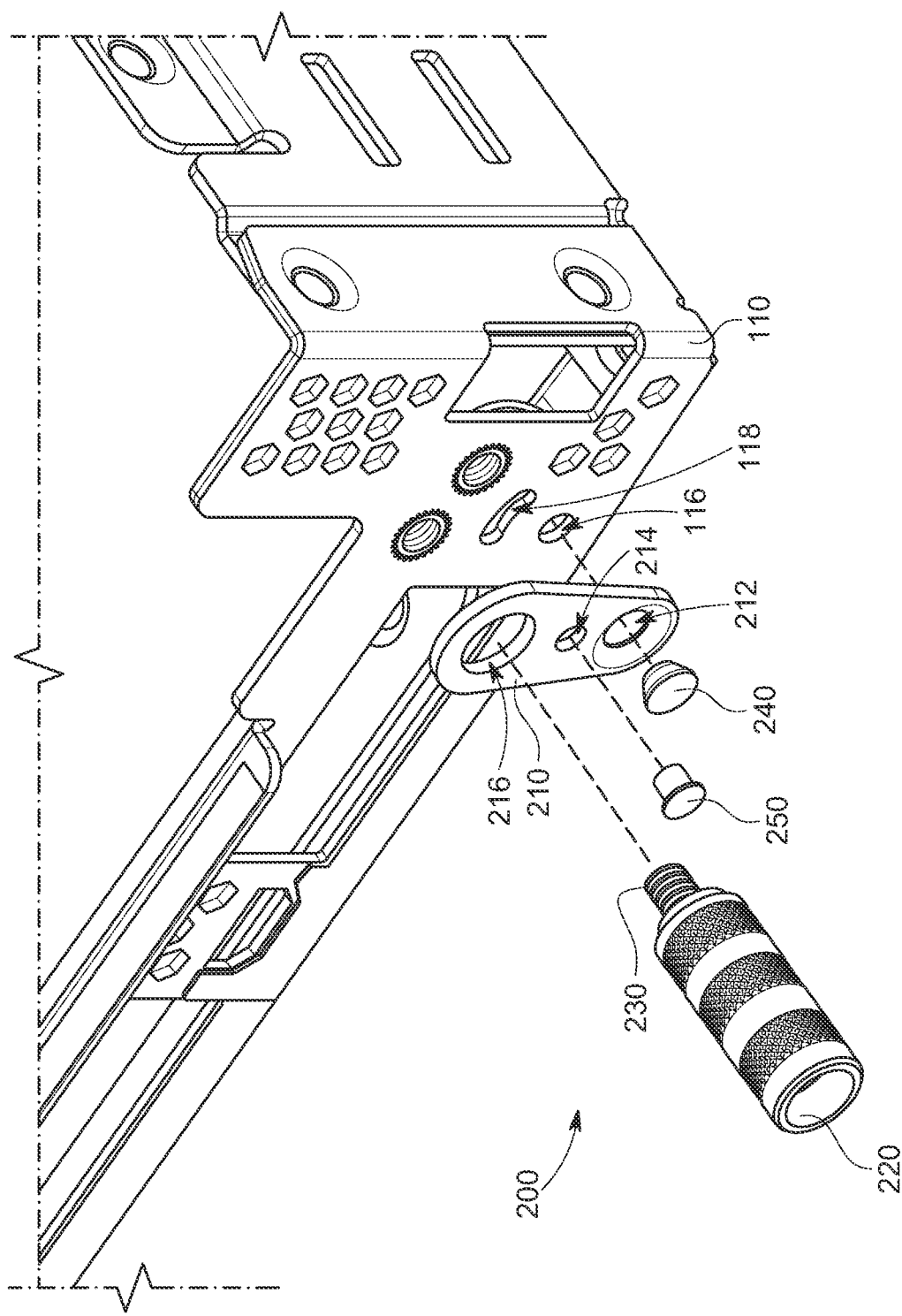
FIG. 4 is an exploded view of the handle of FIGS. 2A and 2B aligned with the tray of FIG. 3, according to aspects of the present disclosure.

FIG. 4 is an exploded view of the handle 200 showing the alignment of the various components of the handle 200 with the tray 110. As shown, the baseplate 210 is positioned relative to the front panel of the tray 110 such that the fastening aperture 212 of the baseplate 210 is aligned with the fastening aperture 116 of the tray 110, and such that the guide aperture 214 of the baseplate 210 is aligned with the guide slot 118 of the tray 110. The fastening pin 240 can be inserted through the fastening aperture 212 and into the fastening aperture 116 to movably couple the baseplate 210 to the tray 110. The guide rod 250 can be inserted through the guide aperture 214 and into the guide slot 118 to limit the movement of the baseplate 210 relative to the tray 110. FIG. 4 also shows that the grip portion 220 and the locking pin 230 can be releasably coupled to the baseplate 210 by being mounted within and/or coupled to an aperture 216 defined in the baseplate 210.

Figure 5A:
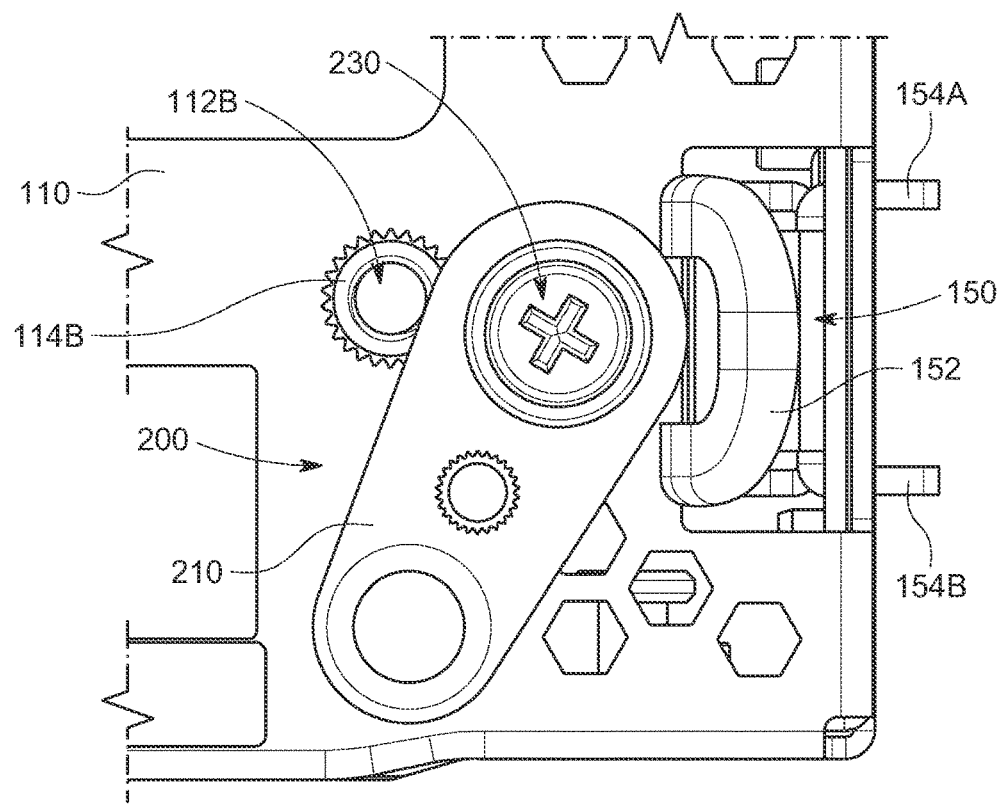
FIG. 5A is a front view of the handle of FIGS. 2A and 2B coupled to the tray of FIG. 3 in a first position, according to aspects of the present disclosure.
Figure 5B:
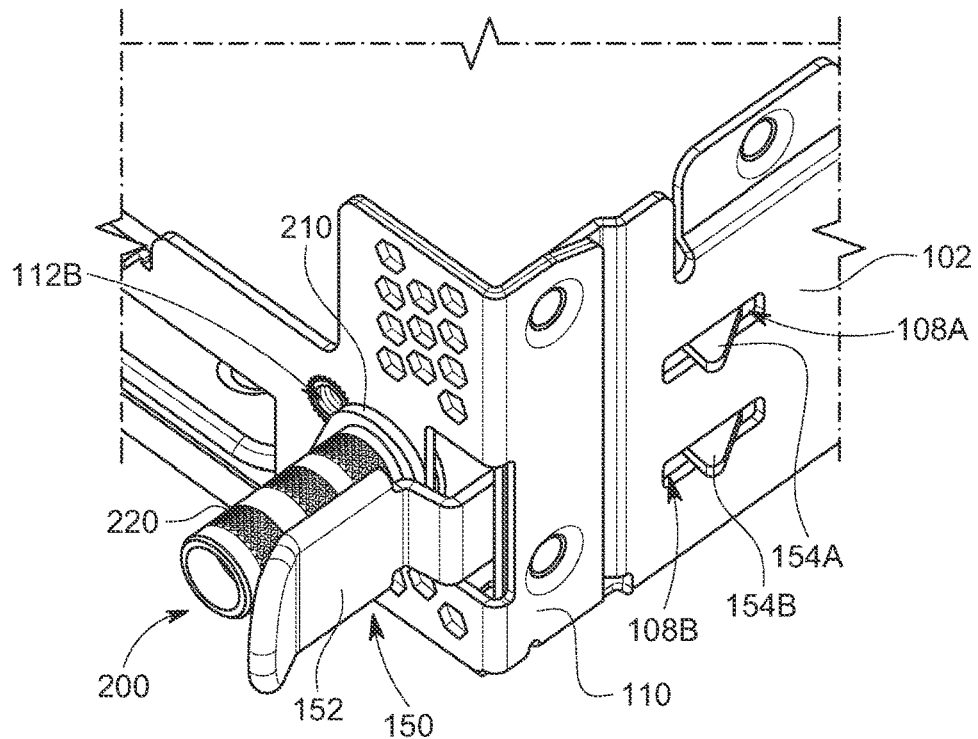
FIG. 5B is a perspective view of the handle coupled to the tray in the first position, according to aspects of the present disclosure.

FIGS. 5A and 5B show the handle 200 and the tray 110 when the baseplate 210 is in a first position relative to the tray 110 and the locking pin 230 is coupled to a first portion of the tray 110. To couple the locking pin 230 to the first portion of the tray 110, the locking pin 230 is moved in a first direction normal to the baseplate 210 (e.g., toward the tray 110) and inserted into the first locking aperture 112A (shown in FIG. 6A). Thus, the locking pin 230 extends into the first locking aperture 112A to secure the baseplate 210 in the first position. In the illustrated implementation, the threaded structure 114A (shown in FIG. 6A) is mounted within the first locking aperture 112A. The external threads of the locking pin 230 mate with the internal threads of the threaded structure 114A to couple the locking pin 230 to the first portion of the tray 110 and secure the baseplate 210 in the first position.

When the baseplate 210 and the handle 200 are in the first position, the grip portion 220 is positioned adjacent to the resilient tab 152 of the latch 150. The grip portion 220 will be close enough to the resilient tab 152 so as to block any movement of the resilient tab 152 from its relaxed position (which is the position illustrated in FIGS. 5A and 5B) toward its deflected position. As shown in FIG. 5B, because the resilient tab 152 cannot move to its deflected position, the locking projections 154A and 154B cannot be removed from their corresponding slots 108A and 108B in the rack 102.

The handle 200 in the first position thus does not allow the latch 150 to be disengaged from the rack 102, which in turn prevents the tray 110 from being removed from the rack 102.

Figure 6A:
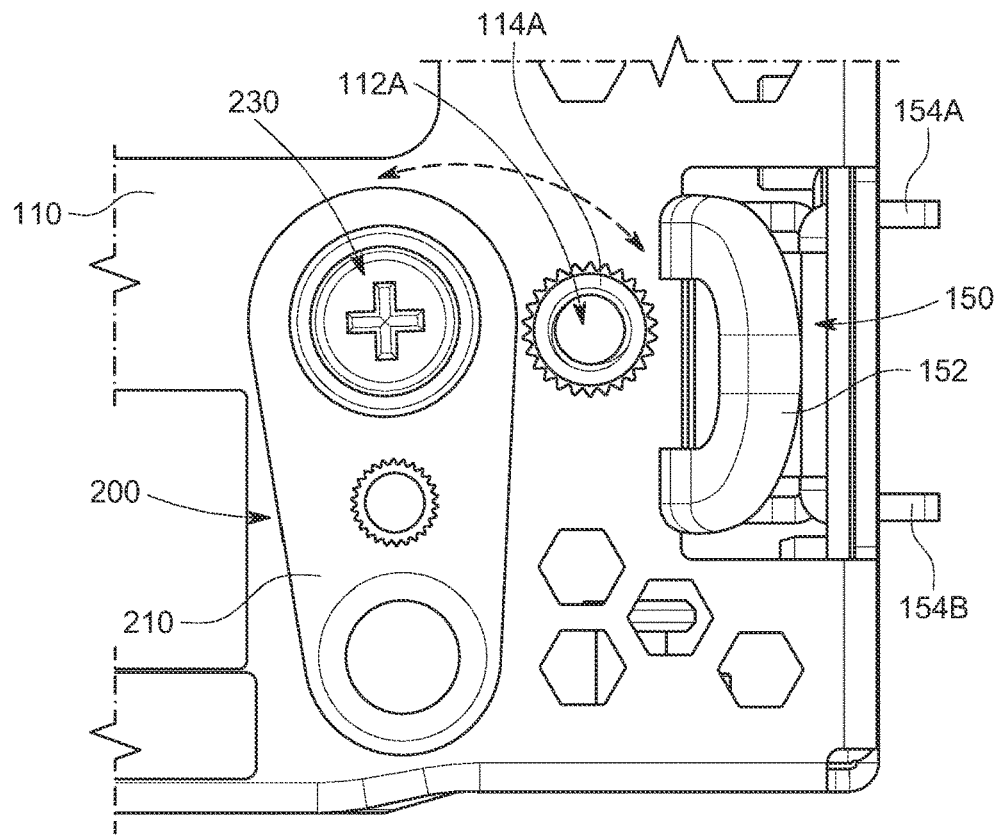
FIG. 6A is a front view of the handle of FIGS. 2A and 2B coupled to the tray of FIG. 3 in a second position, according to aspects of the present disclosure.
Figure 6B:
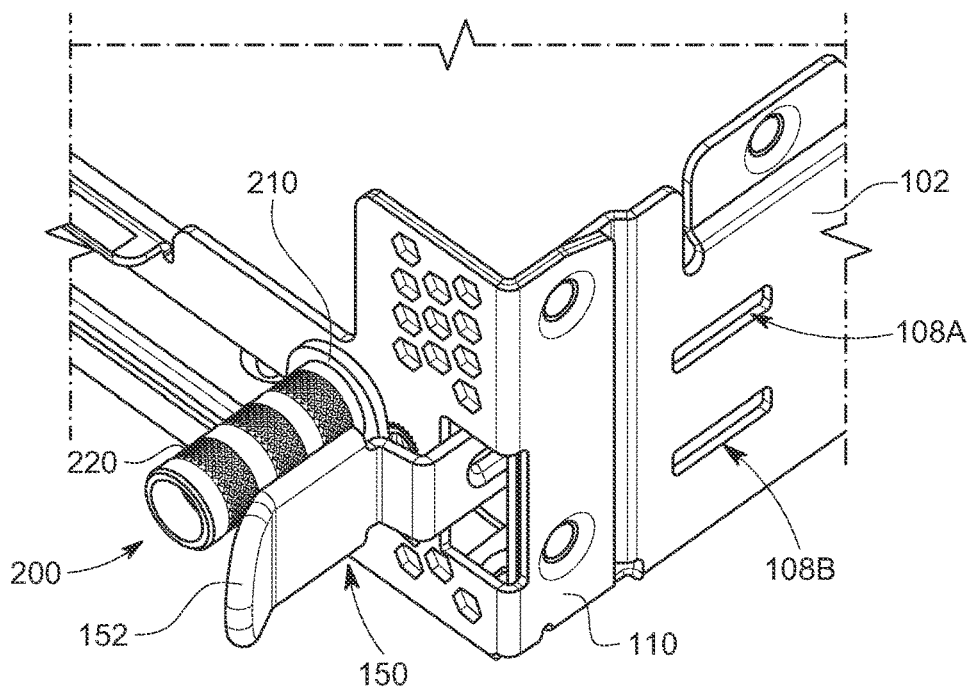
FIG. 6B is a perspective view of the handle coupled to the tray in the second position, according to aspects of the present disclosure.

FIGS. 6A and 6B show the handle 200 and the tray 110 when the baseplate 210 is in a second position relative to the tray 110 and the locking pin 230 is coupled to the second portion of the tray 110. To couple the locking pin 230 to the second portion of the tray 110, the locking pin 230 is moved in the first direction normal to the baseplate 210 and inserted into the second locking aperture 112B (shown in FIGS. 5A and 5B). Thus, the locking pin 230 extends into the second locking aperture 112B to secure the baseplate 210 in the second position. In the illustrated implementation, the threaded structure 114B (shown in FIG. 5A) is mounted within the second locking aperture 112B. The external threads of the locking pin 230 mate with the internal threads of the threaded structure 114B to couple the locking pin 230 to the second portion of the tray 110 and secure the baseplate 210 in the second position.

When the baseplate 210 and the handle 200 are in the second position, the grip portion 220 is spaced apart from the resilient tab 152 of the latch 150. The space between grip portion 220 and the resilient tab 152 allows the resilient tab 152 to be moved from its relaxed position (which is the position shown in FIG. 6A) to its deflected position (which is the position shown in FIG. 6B). As shown in FIG. 6B, when the resilient tab 152 moves to its deflected position, the locking projections 154A and 154B are removed from their corresponding slots 108A and 108B in the rack 102. The handle 200 thus allows the latch 150 to be disengaged from the rack 102, which in turn allows the tray 110 to be removed from the server rack.

To move the baseplate 210 between the first position and the second position, the locking pin 230 is moved in a second direction normal to the baseplate 210 (e.g., away from the tray 110 and opposite the first direction) and removed from the first locking aperture 112A or the second locking aperture 112B, thereby decoupling the locking pin 230 from the tray 110. In implementations with the threaded structure 114A or the threaded structure 114B, the locking pin 230 is first unscrewed and then removed. The baseplate 210 is then moved to the new position and the locking pin 230 is inserted into the first locking aperture 112A or the second locking aperture 112B to couple the locking pin 230 to the tray 110 and secure the baseplate 210 in the new position.

Figure 7A:
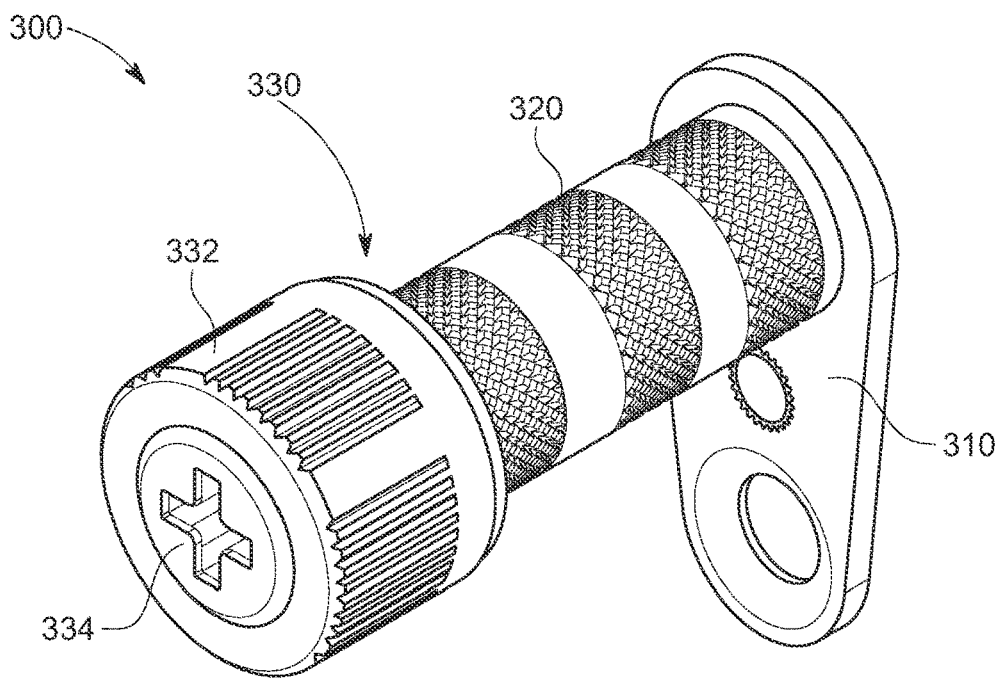
FIG. 7A is a perspective view of a first alternative implementation of the handle of FIGS. 2A and 2B, according to aspects of the present disclosure.
Figure 7B:
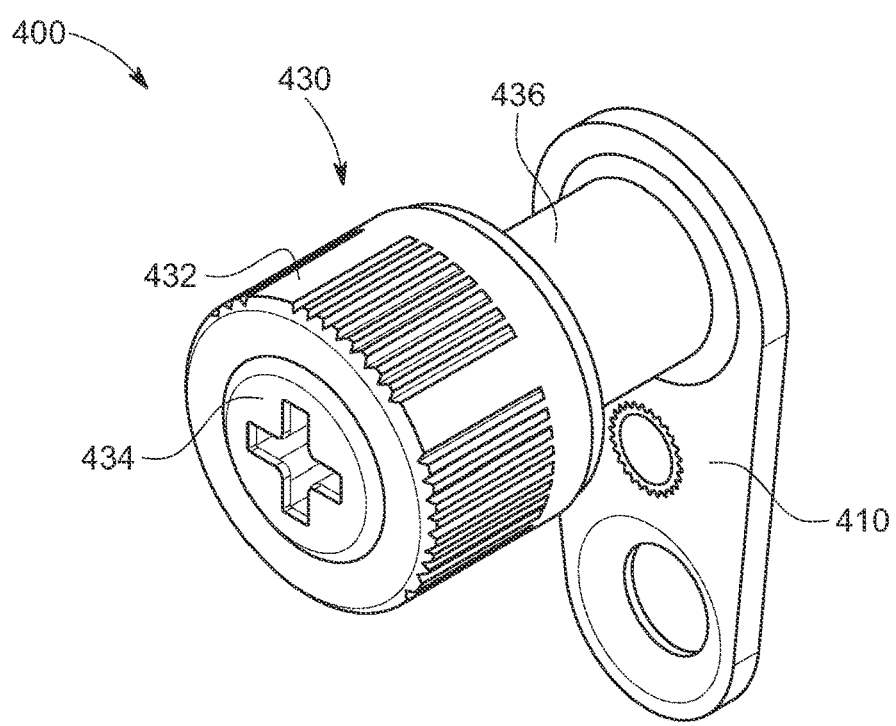
FIG. 7B is a perspective view of a second alternative implementation of the handle of FIGS. 2A and 2B, according to aspects of the present disclosure.
Figure 7C:
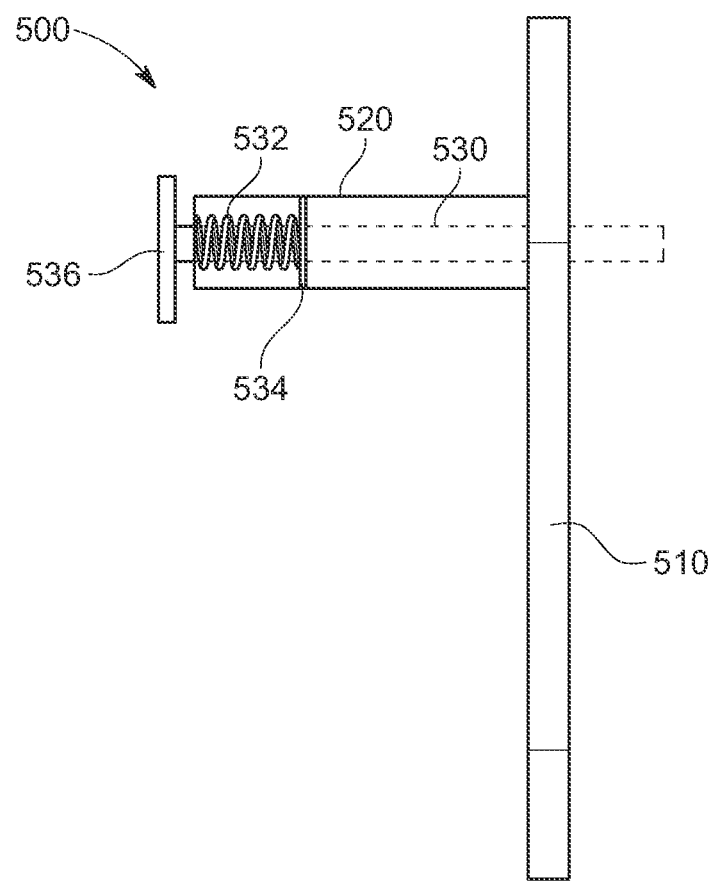
FIG. 7C is a perspective view of a third alternative implementation of the handle of FIGS. 2A and 2B, according to aspects of the present disclosure.

FIGS. 7A-7C show other implementations of a handle that can be used instead of the handle 200. FIG. 7A illustrates a handle 300 that includes a baseplate 310, a grip portion 320 extending from the baseplate 310, and a locking pin 330 that is partially disposed within the grip portion 320. The grip portion 320 is the same as or similar to the grip portion 220 of the handle 200. The locking pin 330 is formed as a thumbscrew with a rotatable portion 332, a screw head 334, and a threaded end portion (not shown) that is similar to or the same as the threaded end portion 232 of the locking pin 230. Most of the length of the locking pin 330 is disposed within the grip portion 320. The rotatable portion 332 can be rotated manually by the user or technician (e.g., without the use of a screwdriver or other tool) to cause the threaded end portion to mate with threaded portions of the tray (e.g., the threaded structure 114A and/or the threaded structure 114B) and move normal to the baseplate 310. However, because the screw head 334 is externally accessible, the user or technician can also use a screwdriver or other tool to rotate the screw head 334 and cause the threaded end portion to mate with threaded portions of the tray.

FIG. 7B illustrates a handle 400 that includes a baseplate 410 and a locking pin 430. The locking pin 430 is also formed as a thumbscrew, and includes a rotatable portion 432, a screw head 434, and a threaded end portion (not shown). Similar to the locking pin 330, a user or technician can manually rotate the rotatable portion 432 to cause the threaded end portion to mate with threaded portions of the tray, or can also use a screwdriver or other tool to cause the threaded end portion to mate with threaded portions of the tray. In this implementation however, the handle 400 does not include a separate grip portion within which the locking pin 430 is disposed. Instead, the locking pin 430 is disposed within a shaft portion 436 that is integrally formed with and/or coupled to the rotatable portion 432. The shaft portion 436 can be coupled to the baseplate 410, and the locking pin 430 can be axially movable within the shaft portion 436. In implementations using the locking pin 430, the rotatable portion 432 and the shaft portion 436 will act as the grip portion that prevents the latch 150 from moving to its deflection position when the handle 400 is in the first position.

FIG. 7C illustrates a handle 500 that includes a baseplate 510, a grip portion 520, and a locking pin 530 that is disposed partially within the grip portion 520 and is biased in a direction toward the tray by a spring 532. The spring 532 is positioned between the end of the grip portion 520 and a flange 534 of the locking pin 530. The user or technician can pull back on the locking pin 530 via an external handle 536 to move the locking pin 530 away from the tray and out of the first locking aperture 112A or the second locking aperture 112B. This movement of the external handle 536 will compress the spring between the flange 534 and the end of the grip portion 520. Once the handle 500 is moved to the other position, the spring 532 will expand and press against the flange 534 to cause the locking pin 530 to move back toward the tray and into the first locking aperture 112A or the second locking aperture 112B. Because of the automatic movement of the locking pin 530 toward the tray due to the presence of the spring 532, the tray that is used with the locking pin 530 will generally not need to include any threaded structures to which the locking pin 530 mates. Instead, the force provided by the spring that biases the locking pin 530 toward the tray and into the first locking aperture 112A or the second locking aperture 112B is generally sufficient to prevent the locking pin 530 from being inadvertently retracted. However, the tray may still include threaded structures in the first locking aperture 112A and/or the second locking aperture 112B, so long as the locking pin 530 is still able to be inserted into the first locking aperture 112A and the second locking aperture 112B.

While the various illustrated implementations show a tray that includes apertures with a threaded component that receives the locking pin of any of the handles 200, 300, 400, and 500, the locking pin of a handle used with the tray may be configured to be coupled with the tray using other means. For example, in some implementations the tray could have a groove or recess that receives the correspondingly-shaped head of the locking pin and maintains the handle in the different positions. The groove or recess can be sufficiently deep so that inadvertent contact with the handle does not cause the handle to move positions. In another example, the tray does not have any sort of locking features, and the locking pin is pressed against the tray with sufficient force so that inadvertent contact with the handle does not cause the handle to move positions.

Although the disclosed embodiments have illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described been above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A handle for securing a tray of a computing system, the handle comprising:
    a baseplate configured to be movably coupled to the tray, the baseplate being movable between at least a first position and a second position relative to the tray when coupled to the tray, the first position preventing removal of the tray from the computing system, the second position allowing removal of the tray from the computing system;
    a locking pin extending from the baseplate and being configured to be coupled to (a) a first portion of the tray when the baseplate is in the first position, and (b) a second portion of the tray when the baseplate is in the second position, the locking pin being movable in (i) a first direction relative to the baseplate to be coupled to the first portion of the tray and the second portion of the tray, and (ii) a second opposing direction relative to the baseplate to be uncoupled from the first portion of the tray and the second portion of the tray; and
    a fastening pin extending from the baseplate, the fastening pin being configured to be inserted into an aperture defined in the tray to movably couple the baseplate to the tray.

2. The handle of claim 1, wherein the fastening pin is configured to rotatably mate with the aperture defined in the tray such that the baseplate is rotatable between the first position and the second position.

3. The handle of claim 1, further comprising a guide rod extending from the baseplate, the guide rod being configured to extend into a slot defined in the tray and move within the slot as the baseplate moves between the first position and the second position.

4. The handle of claim 3, wherein the movement of the guide rod within the slot limits movement of the baseplate relative to the tray.

5. The handle of claim 3, wherein when guide rod is positioned at a first end of the slot, the locking pin is aligned with the first portion of the tray, and when the guide rod is positioned at a second end of the slot, the locking pin is aligned with the second portion of the tray.

6. The handle of claim 1, wherein the locking pin is configured to:
    extend into a first locking aperture defined in the tray to secure the baseplate in the first position;
    extend into a second locking aperture defined in the tray to secure the baseplate in the second position; and
    retract from the first locking aperture or the second locking aperture to allow the baseplate to move between the first position and the second position.

7. The handle of claim 6, wherein the locking pin includes external threads that are configured to mate with internal threads of the first locking aperture to secure the baseplate in the first position, and to mate with internal threads of the second locking aperture to secure the baseplate in the second position.

8. The handle of claim 6, further comprising a grip portion extending from the baseplate, the locking pin being disposed partially within the grip portion and being axially movable within the grip portion (i) in the first direction relative to the baseplate to be inserted into the first aperture and the second aperture, and (ii) in the second direction relative to the baseplate to be removed from the first aperture and the second aperture.

9. The handle of claim 8, wherein the locking pin is formed by a captive screw, a thumbscrew, or a spring-loaded rod.

10. A handle for securing a tray of a computing system, the handle comprising:
    a baseplate configured to be movably coupled to the tray, the baseplate being movable between at least a first position and a second position relative to the tray when coupled to the tray, the first position preventing removal of the tray from the computing system, the second position allowing removal of the tray from the computing system;
    a locking pin extending from the baseplate and being configured to be coupled to (a) a first portion of the tray when the baseplate is in the first position, and (b) a second portion of the tray when the baseplate is in the second position, the locking pin being movable in (i) a first direction relative to the baseplate to be coupled to the first portion of the tray and the second portion of the tray, and (ii) a second opposing direction relative to the baseplate to be uncoupled from the first portion of the tray and the second portion of the tray; and
    a guide rod extending from the baseplate, the guide rod being configured to extend into a slot defined in the tray and move within the slot as the baseplate moves between the first position and the second position.

11. The handle of claim 10, wherein the movement of the guide rod within the slot limits movement of the baseplate relative to the tray.

12. The handle of claim 10, wherein when guide rod is positioned at a first end of the slot, the locking pin is aligned with the first portion of the tray, and when the guide rod is positioned at a second end of the slot, the locking pin is aligned with the second portion of the tray.

* * * * *